(12) United States Patent
Huang et al.

(10) Patent No.: US 9,015,543 B2
(45) Date of Patent: Apr. 21, 2015

(54) DIAGNOSIS-AWARE SCAN CHAIN STITCHING

(71) Applicant: Mentor Graphics Corporation, Wilsonville, OR (US)

(72) Inventors: Yu Huang, Sudbury, MA (US); Wu-Tung Cheng, Lake Oswego, OR (US); Ruifeng Guo, Portland, OR (US); Liyang Lai, Wilsonville, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 117 days.

(21) Appl. No.: 13/689,653

(22) Filed: Nov. 29, 2012

(65) Prior Publication Data

US 2013/0166976 A1    Jun. 27, 2013

Related U.S. Application Data

(60) Provisional application No. 61/564,801, filed on Nov. 29, 2011, provisional application No. 61/567,040, filed on Dec. 5, 2011.

(51) Int. Cl.
*G01R 31/28* (2006.01)
*G01R 31/3177* (2006.01)
*G01R 31/3185* (2006.01)
*G06F 17/50* (2006.01)

(52) U.S. Cl.
CPC .... *G01R 31/3177* (2013.01); *G01R 31/318583* (2013.01); *G06F 17/5081* (2013.01)

(58) Field of Classification Search
CPC ............................................. G01R 31/318555

USPC .......................................... 714/727, 726, 741
See application file for complete search history.

(56) References Cited

U.S. PATENT DOCUMENTS

| | | | | |
|---|---|---|---|---|
| 7,426,448 | B2 * | 9/2008 | Song et al. ..................... | 702/117 |
| 7,788,058 | B2 * | 8/2010 | Song et al. ..................... | 702/117 |
| 8,374,383 | B2 * | 2/2013 | Long et al. ..................... | 382/100 |
| 2005/0168228 | A1 * | 8/2005 | Song et al. ..................... | 324/501 |

OTHER PUBLICATIONS

F. Wang, Y. Hu, Y. Huang, H. Li, and X. Li, "Deterministic Diagnostic Pattern Generation (DDPG) for Compound Defects," Proc. of ITC, paper 14.1, 2008.
F. Wang, Y. Hu, Y. Huang, J. Ye, and X. Li, "Observation point oriented deterministic diagnosis pattern generation (DDPG) for chain diagnosis," Proc. of ATS, pp. 185-190, 2008.

\* cited by examiner

*Primary Examiner* — Fritz Alphonse

(57) ABSTRACT

Aspects of the invention relate to techniques for determining scan chains that could be diagnosed with high resolution. A circuit design and the information of scan cells for the circuit design are analyzed to determine information of potential logic relationship between the scan cells. The information of potential logic relationship between the scan cells may comprise information of fan-in cones for the scan cells. Based at least in part on the information of potential logic relationship between the scan cells, scan chains may be formed. The formation of scan chains may be further based on layout information of the circuit design. The formation of scan chains may be further based on compactor information of the circuit design.

20 Claims, 10 Drawing Sheets

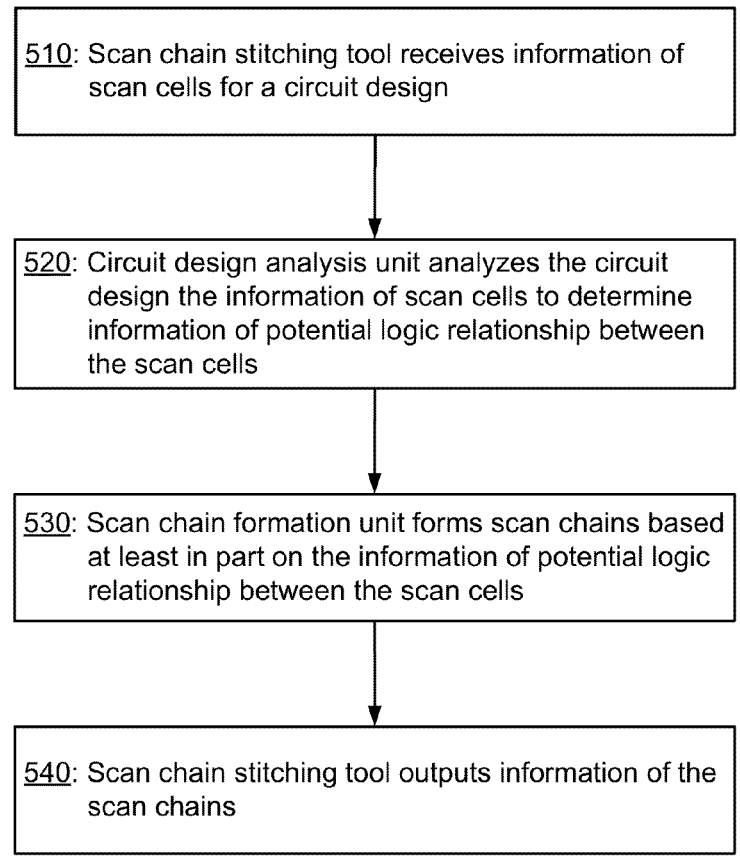
Flow chart 500
FIG. 5

| | |
|---|---|
| 1 | Initialize scan cells' scan chains; |
| 2 | Set *count_fail* = 0; |
| 3 | for (int $t = 0$ ; ; $t$ ++) { |
| 4 | Randomly choose one scan cell $C_T$; |
| 5 | From $C_T$'s fanin logic cone, randomly choose one scan cell $C_f$ that is in the same scan chain as $C_T$; |
| 6 | Swap $C_f$ with other scan cells to make $C_T$ and $C_f$ be in different scan chains; |
| 7 | Set ? = the increased number of potential sensitive cells; |
| 8 | If (? > 0) {Accept the swap; count_fail=0; } |
| 9 | else if (? == 0) {Accept the swap; } |
| 10 | else { |
| 11 | With the probability e $^{?*t/\tau}$: { Accept the swap; *count_fail* = 0; } |
| 12 | With probability 1 – e $^{?*t/\tau}$: { Refuse the swap; *count_fail* ++; } |
| 13 | } |
| 14 | if (*count_fail* == $N_{break}$) {break;} |
| 15 | } |

DIAGNOSIS-AWARE SCAN CHAIN STITCHING

RELATED APPLICATIONS

This application claims priority to U.S. Provisional Patent Application No. 61/564,801, entitled "Diagnosis Aware Scan Cell Stitching," filed on Nov. 29, 2012, and naming Yu Huang et al. as inventors, and U.S. Provisional Patent Application No. 61/567,040, entitled "Diagnosis Aware Scan Chain Stitching," filed on Dec. 5, 2012, and naming Yu Huang et al. as inventors, which applications are both incorporated entirely herein by reference.

FIELD OF THE INVENTION

The present invention relates to the field of integrated circuit (IC) testing technology.

Various implementations of the invention may be particularly useful for scan chain fault diagnosis.

BACKGROUND OF THE INVENTION

Scan chains have been widely used in digital circuits as a design-for-test (DFT) technique. Scan elements and clocking circuitry occupy about 30% of silicon area of an IC chip. It has been estimated that 10-30% of defects found in defective IC chips are associated with scan chains and that 50% of chip failures are caused by scan chain defects. Hence, diagnosing scan chain faults with good resolution is important to guide silicon debug, physical failure analysis (PFA), and yield learning process.

Chain fault diagnosis techniques can be classified into three categories: tester-based, hardware-based, and software-based techniques. In the tester-based diagnosis techniques, a tester, cooperated with a PFA equipment, is used to locate faulty scan cells. These techniques can provide a good chain diagnostic resolution based on, e.g., measuring signal change frequency. They may not be suitable, however, for volume diagnosis due to their high cost and long diagnostic time.

The hardware-based diagnosis techniques employ dedicated scan cell structures or scan chain designs. For example, multiplexes can be added to propagate data from one scan chain to another scan chain. Some global signals and specific circuitries such as XOR gates may also be added to enable certain scan cells to be either set or reset after shift-in, and faulty scan cells can then be identified by analyzing the shift-out bits. While these hardware-based techniques can effectively identify faulty scan cells, the extra diagnostic signals and circuitry could lead to prohibitive hardware overhead.

The software-based diagnosis techniques are based on algorithmic diagnosis processes. To determine candidates of faulty scan cells, observed failing and passing responses are analyzed. Without the requirement of being tied to an expensive tester or the need of dedicated hardware, these techniques are suitable for volume diagnosis. However, the diagnostic resolution may be problematic if scan chains are not carefully designed. It is thus desirable to develop techniques for scan chain stitching based on diagnosis needs.

BRIEF SUMMARY OF THE INVENTION

Aspects of the invention relate to techniques for determining scan chains that could be diagnosed with high resolution. The techniques employ information of scan cells for a circuit design and can be applied no matter whether scan chains are formed or not. If scan chains are preformed, the information of scan cells may comprise information of the preformed scan chains and the preformed scan chains will be modified to improve diagnostic resolution. If scan chains are not preformed, scan cells will be selected and stitched to form scan chains easy to be diagnosed.

With various implementations of the invention, the circuit design and the information of the scan cells are analyzed to determine information of potential logic relationship between the scan cells. The information of potential logic relationship between the scan cells may comprise information of fan-in cones for the scan cells. The fan-in cone of a scan cell may be derived by tracing back from the scan cell.

Based at least in part on the information of potential logic relationship between the scan cells, scan chains may be formed. Some embodiments of the invention first determine information of potential sensitive cells based on the information of potential logic relationship between the scan cells. A potential sensitive cell of a scan chain being a scan cell of which fan-in cone contains no scan cells from the scan chain. The obtained information of fan-in cones for the scan cells is then employed to determine scan chains. The number and the distribution of potential sensitive cells for the scan chains may be optimized.

The formation of scan chains may be further based on layout information of the circuit design. The layout information may comprise information of wire lengths between scan cells.

The formation of scan chains may be further based on compactor information of the circuit design.

BRIEF DESCRIPTION OF THE DRAWINGS

FIG. 5 illustrates a flowchart describing diagnosis-aware scan chain stitching methods that may be employed by various embodiments of the invention.

FIG. 7 presents an example of an algorithm for selecting scan cells for forming scan chains according to various embodiments of the invention.

DETAILED DESCRIPTION OF THE INVENTION

General Considerations

Various aspects of the present invention relate to diagnosis-aware scan chain stitching. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "form," "analyze," and "determine" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Illustrative Operating Environment

Figure 1:
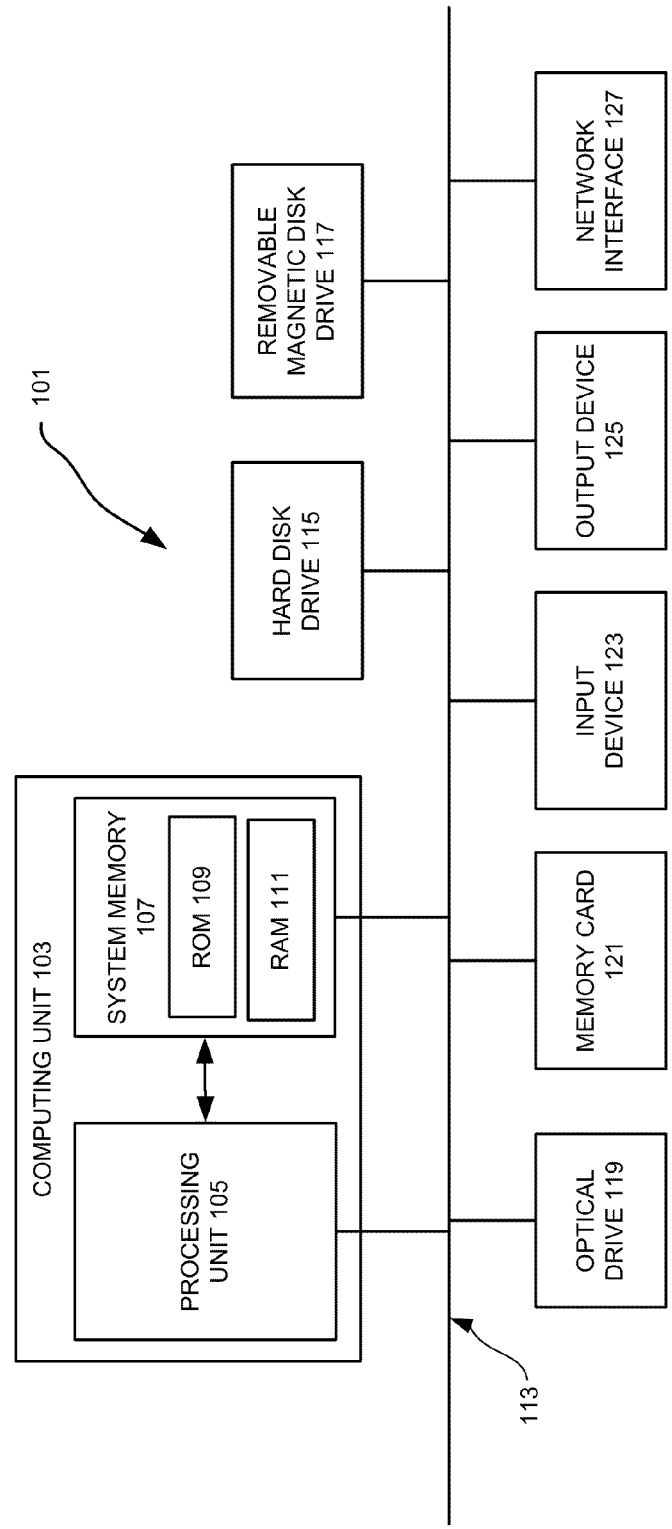
FIG. 1 illustrates a programmable computer system with which various embodiments of the invention may be employed.

Various examples of the invention may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Terminology

This disclosure uses several terms related to scan chain fault diagnosis. These terms are defined here. A "chain pattern" (or "chain flush pattern") is a test pattern that is used to test scan chains through shift-in and shift-out operations. No capture clocks are applied when a chain pattern is used. A "scan pattern" (or "scan ATPG pattern") is a test pattern that is generated by Automatic Test Pattern Generation (ATPG) tools to test system logic and/or scan chains. The process of applying a scan pattern usually involves three phases: shift-in, capture and shifting-out.

Figure 2:
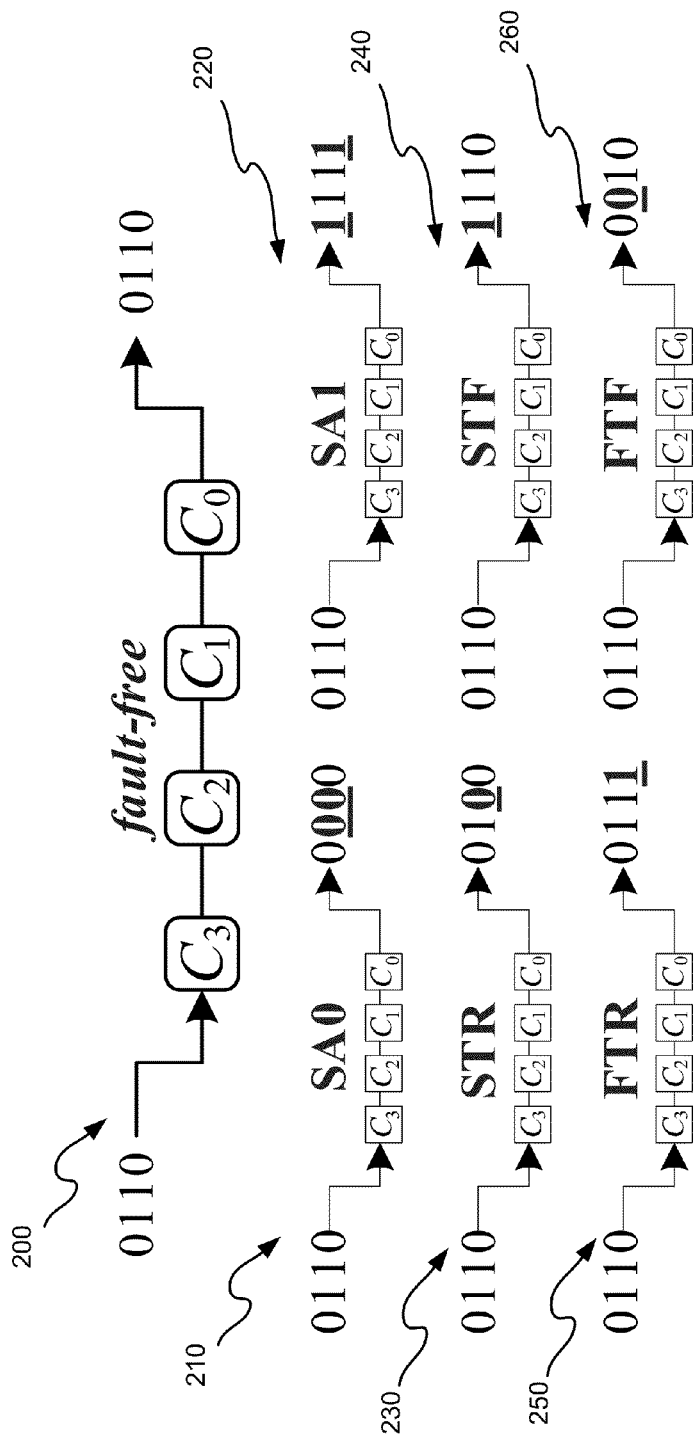
FIG. 2 illustrates examples of a chain pattern being shift in and out from a scan chain in which Stuck-At-0 (SA0), Stuck-At-1 (SA1), Slow-To-Rise (STR), Slow-To-Fall (STF), Fast-To-Rise (FTR), and Fast-To-Fall (FTF) faults occur.

There are six common single-sided fault models for scan chains: Stuck-At-0 (SA0), Stuck-At-1 (SA1), Slow-To-Rise (STR), Slow-To-Fall (STF), Fast-To-Rise (FTR), and Fast-To-Fall (FTF). Double-sided fault models include SLOW (including STR and STF) and FAST (including FTR and FTF). The double-sided faults can be diagnosed in the same way as the single-sided faults. In FIG. 2, a chain pattern 0110 is shifted through four scan cells. The fault effects of six fault models are given by 210-260, respectively. In this example, applying the chain flush pattern helps to determine not only whether a scan chain is faulty but also the identity of the fault model. However, it is insufficient for locating the faulty scan cell. Analysis of failing and passing responses under scan patterns is often needed.

Sensitive bits for a chain fault are bits in a test pattern that may "sense" the chain fault. For SA0 and SA1 faults, the sensitive bits are 1's and 0's, respectively. For timing faults (STR, STF, FTR, and FTF), sensitive bits are in the form of bit-pairs because a specific transition is usually required. For example, a transition from 0 to 1 is needed to sense a STR fault.

For a specific fault model, a scan cell is a sensitive cell if it captures a sensitive bit after at least one scan pattern is launched.

Resolution Of Scan Chain Fault Diagnosis

Figure 3:
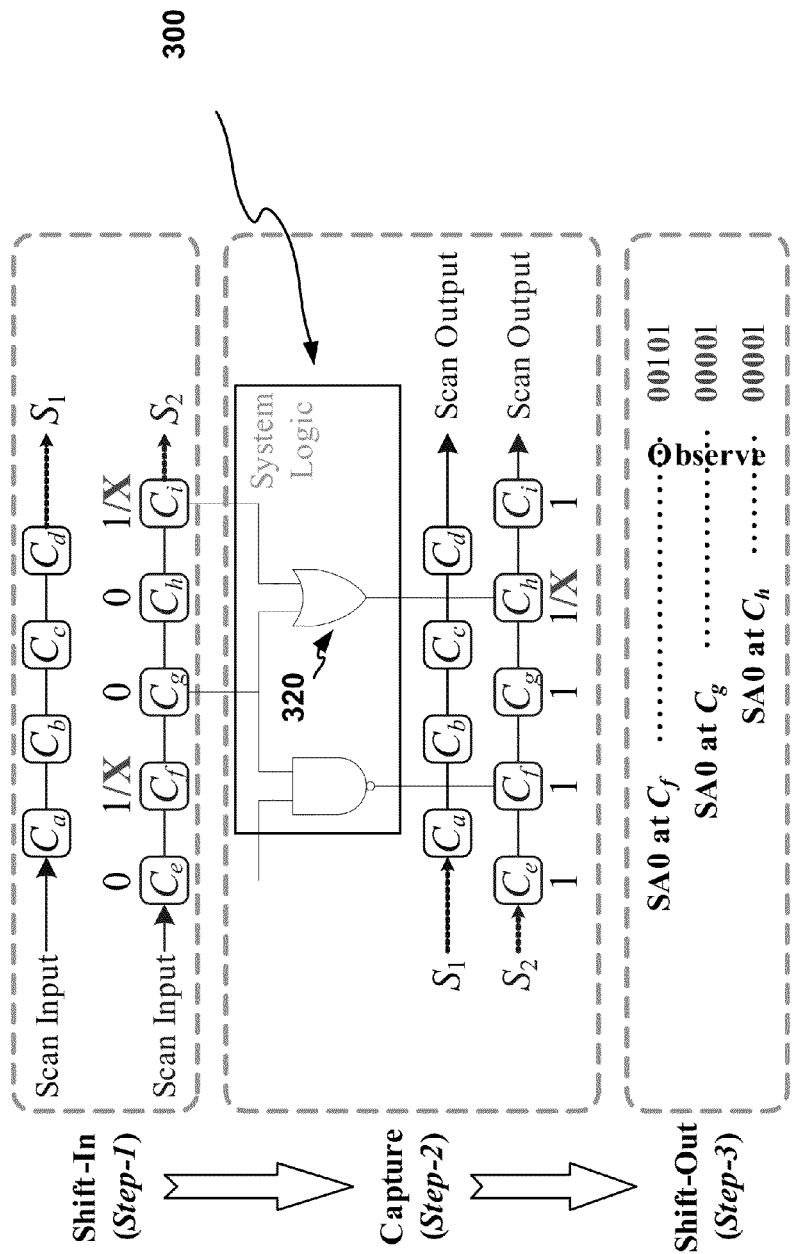
FIG. 3 illustrates an example of scan chain fault diagnosis.

FIG. 3 illustrates an example of scan chain fault diagnosis. The circuit in the figure has two scan chains $S_1$ and $S_2$ with totally nine scan cells from $C_a$ to $C_i$. Only partial system logic 300 connecting scan cells $C_f$, $C_g$, $C_h$, and $C_i$ is shown. The result of shifting in and out a chain pattern indicates a SA0 fault exists in $S_2$.

To identify faulty scan cell candidates, scan patterns may be applied. For example, a scan pattern "01001" is shifted into $S_2$. If no faults exist, bits 11111 should be captured by and shifted out from $S_2$. The SA0 fault at $C_f$, $C_g$, or $C_h$, can lead to different observed bits shown by 340. To locate the faulty scan cell, a conventional software-based chain diagnosis method usually includes the following three steps.

Step-1: For each scan pattern, X-mask all the sensitive bits shifted into the faulty scan chain. The value X means, during shift-in, the bit of a scan cell may be contaminated (or changed) by the scan chain fault. In FIG. 3, bits of $C_f$ and $C_i$ are sensitive bits for SA0 fault in $S_2$ and are thus masked with Xs.

Step-2: Simulate the X-masked scan patterns to determine the bits captured by scan cells. In FIG. 3, simulating the pattern 0X00X results in 111X1 captured by $C_e$, $C_f$, $C_g$, $C_h$, and $C_i$. The X captured by $C_h$ means that $C_h$ may capture either 0 or 1. It depends on whether $C_i$ is contaminated during shift-in because of the OR gate 320. Hence, among five scan cells in $S_2$, only $C_h$ does not capture a sensitive bit for the SA0 fault.

Step-3: Compare the simulated captured bits with the observed shift-out bits to locate the faulty scan cell. In the example in FIG. 3, if the actual SA0 fault occurs at $C_f$, bits 00101 will be observed. The comparison between the simulated captured bits 111X1 and the observed bits 00101 shows, during shift-out, the sensitive bits of $C_e$ and $C_f$ are contaminated whereas the sensitive bit of $C_g$ is not. Therefore, the actual SA0 fault is determined to occur at $C_f$.

If the SA0 fault occurs at $C_g$, bits 00001 will be observed. The comparison between the simulated captured bits 111X1 and the observed bits 00001 can only lead to a conclusion that the fault occurs at $C_g$ or $C_h$. That is because the value X captured by $C_h$ is not a sensitive bit. If $C_h$ captures a sensitive bit 1 and a bit value of 1 is shifted out from it, the SA0 fault can be determined to occur at $C_g$ not $C_h$. If $C_h$ captures 1, but a bit value of 0 is shifted out, the SA0 fault can be determined to occur at $C_h$ not $C_g$.

In the above example, the reason why SA0 faults at $C_g$ and $C_h$ cannot be distinguished is that $C_h$ is not a sensitive cell. Increasing the number of sensitive cells, therefore, may improve chain fault diagnosis resolution. In general, to increase sensitive cells, the number of Xs captured in the faulty scan chain needs to be reduced.

Scan patterns specifically designed for increasing sensitive cells may be used to improve the chain fault diagnostic resolution. However, not all the non-sensitive cells can become sensitive cells through generating extra patterns. This can be explained with the example shown in FIG. 3. To make $C_h$ a sensitive cell for the SA0 fault, $C_h$ should capture a bit value of 1, which requires either $C_g$ or $C_i$ obtain a bit value of 1 after shift-in. Because $C_g$ and $C_i$ are in the same scan chain as $C_h$, however, the bit 1 in either $C_g$ or $C_i$ will be masked to X and $C_h$ will always capture X no matter what scan patterns are applied.

To effectively increase the number of sensitive cells, various embodiments of the invention employ diagnosis-aware scan chain stitching techniques. With these techniques, scan chains are designed or modified based on potential logic relationship between scan cells. The detail of these techniques is discussed in the next section.

Scan Chain Stitching Tools And Methods

Figure 4:
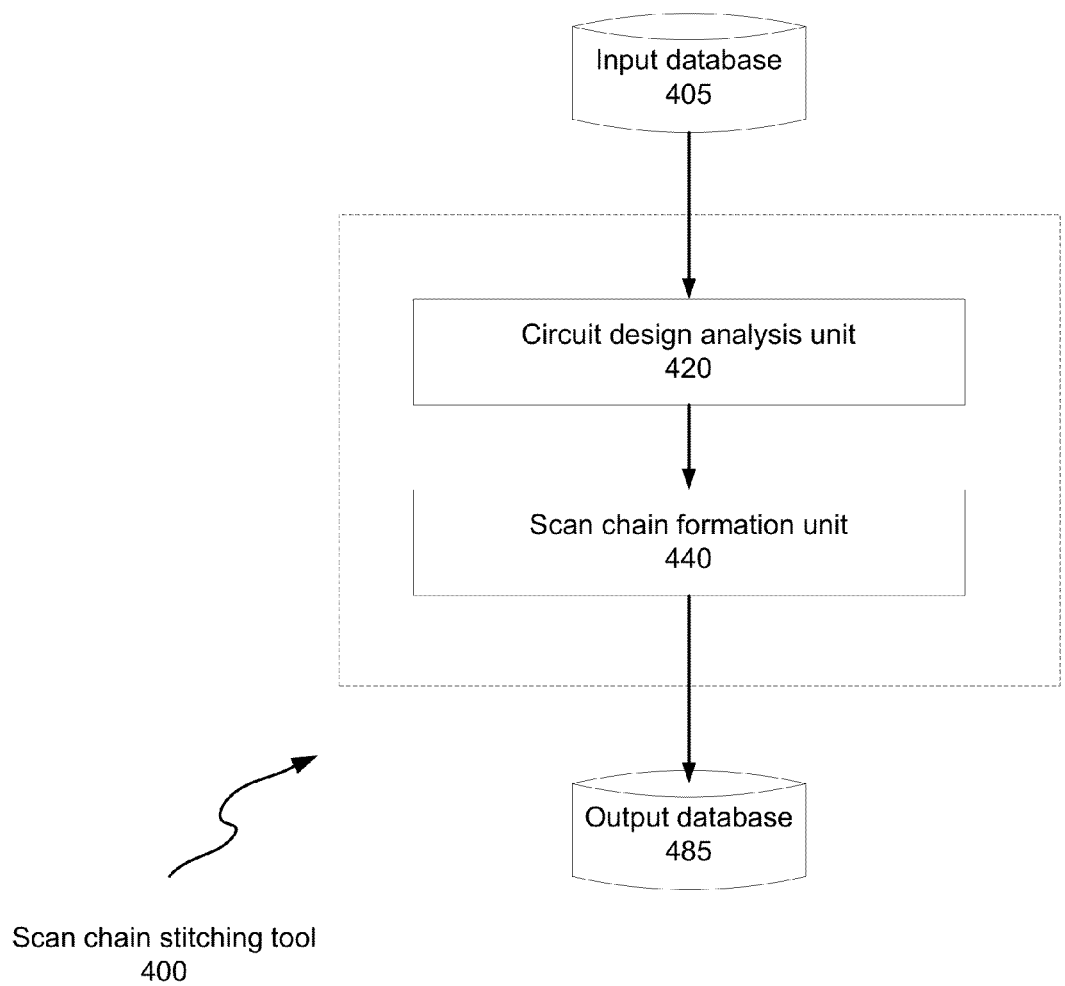
FIG. 4 illustrates an example of a scan chain stitching tool according to various embodiments of the invention.

FIG. 4 illustrates an example of a scan chain stitching tool according to various embodiments of the invention. As seen in the figure, the scan chain stitching tool 400 includes two units: a circuit design analysis unit 420 and a scan chain formation unit 440. As will be discussed in more detail below, some implementations of the scan chain stitching tool 400 may cooperate with (or incorporate) one or more of an input database 405 and an output database 485. While the input database 405 and the output database 485 are shown as separate units in FIG. 4, a single data storage medium may be used to implement some or all of these databases.

According to some embodiments of the invention, either or both of the circuit design analysis unit 420 and the scan chain formation unit 440 may be implemented by executing programming instructions on one or more programmable computers/computer systems, such as the computing system illustrated in FIG. 1. Correspondingly, some other embodiments of the invention may be implemented by software instructions, stored on a non-transitory computer-readable medium, for instructing one or more programmable computers/computer systems to perform the functions of either or both of the circuit design analysis unit 420 and the scan chain formation unit 440. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

For ease of understanding, diagnosis-aware scan chain stitching methods that may be employed according to various embodiments of the invention will be described with reference to the scan chain stitching tool 400 illustrated in FIG. 4 and the method for diagnosis-aware scan chain stitching in the flow chart 500 in FIG. 5. It should be appreciated, however, that alternate implementations of a scan chain stitching tool may be used to perform the method for diagnosis-aware scan chain stitching shown in the flow chart 500 according to various embodiments of the invention. In addition, it should be appreciated that implementations of the scan chain stitching tool 400 may be employed with other methods for diagnosis-aware scan chain stitching according to different embodiments of the invention.

Initially, in operation 510, the scan chain stitching tool 400 receives information of scan cells for a circuit design. The diagnosis-aware scan chain stitching methods according to various embodiments of the invention can be applied to situations where scan chains are to be formed or where scan chains are already formed by using, for example, conventional scan chain insertion techniques. In the latter situation, the information of scan cells may include information of the preformed scan chains.

Next, in operation 520, the circuit design analysis unit 420 analyzes the circuit design and the information of scan cells to determine information of potential logic relationship between the scan cells.

Figure 6B:
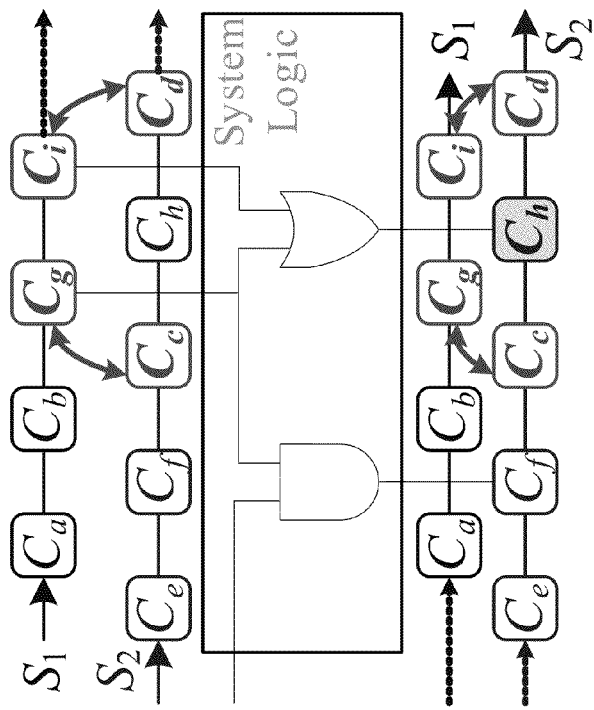
FIG. 6b illustrates an example of scan cell swapping based on information of potential logic relationship between the scan cells that comprises fan-in cone information for the scan cells according to various embodiments of the invention.
Figure 6A:
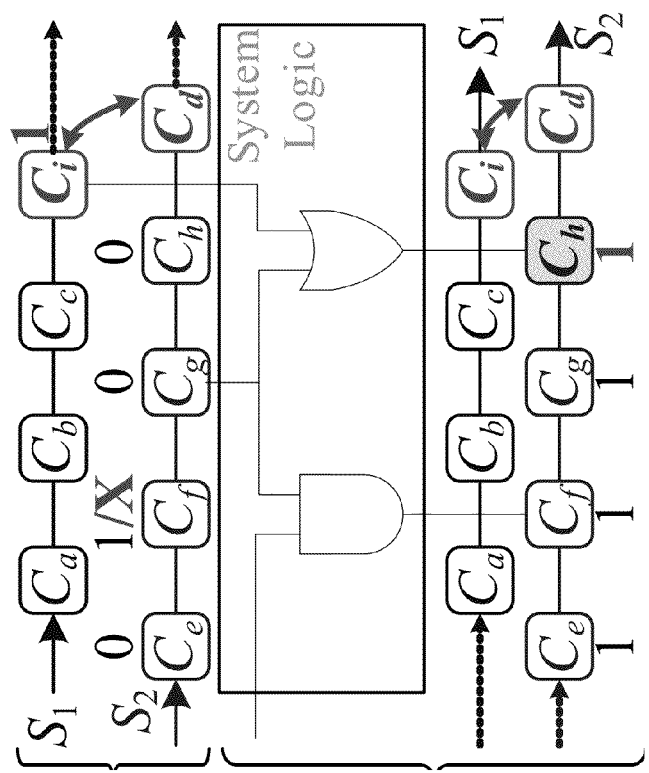
FIG. 6a illustrates an example of scan cell swapping based on information of potential logic relationship between the scan cells obtained by using scan patterns along with the X-masking technique according to various embodiments of the invention.

As discussed in the previous section, increasing the number of sensitive cells can improve the diagnostic resolution. A scan cell is not a sensitive cell if the scan cell captures an X after a scan pattern is X-masked. Therefore, the diagnostic resolution will be improved if the number of Xs captured in the faulty scan chain is reduced. In the example shown in FIG. 3, the scan cells of $C_g$, $C_i$ and $C_h$ are all on the scan chain $S_2$. Scan cells $C_g$ and $C_i$ are in the fan-in cone of $C_h$. Because the bit of $C_i$ is masked to X during shift-in, $C_h$ captures an X. If $C_i$ and $C_d$ are swapped as shown in FIG. 6a, the bit of $C_i$ will not be masked to X and $C_h$ becomes a sensitive cell. Therefore, the diagnostic resolution may be improved by changing scan cells belong to different scan chains or assigning scan cells to different scan chains if these scan cells have a logic relationship like the one between $C_i$ and $C_h$. In some embodiments of the invention, the information of potential logic relationship between the scan cells may be obtained by using scan patterns along with the X-masking technique.

In the above process, $C_i$ is identified based on the scan pattern used. In many circumstances, scan chains are determined or formed before ATPG. It is thus desirable to obtain the information of potential logic relationship between the scan cells without using scan patterns. With various implementations of the invention, the information of potential logic relationship may comprise information of fan-in cones for the scan cells. The fan-in cone for a scan cell may be determined by tracing back from the scan cell. If no other scan cells assigned to the same scan chain are in the fan-in cone of a scan cell, this scan cell is referred to as a potential sensitive cell. As illustrated in FIG. 6b, before swapping the pair of $C_d$ and $C_i$ and the pair of $C_c$ and $C_g$, both $C_g$ and $C_i$ are in the fan-in cone of $C_h$. Thus $C_h$ is not a potential sensitive cell. After swapping, $C_h$ becomes a potential sensitive cell and no matter under what scan patterns are used, $C_h$ will not capture X when $S_2$ is a faulty scan chain.

Next, in operation 530, the scan chain formation unit 440 forms scan chains based at least in part on the information of potential logic relationship between the scan cells. The forming may comprise first determining potential sensitive cells based on the information of potential logic relationship between the scan cells and then employing information of the potential sensitive cells to determine scan chains.

FIG. 7 presents an example of an algorithm for selecting scan cells for forming scan chains according to various embodiments of the invention. At line 1 of the algorithm, scan chains are initialized. The scan cells can be either randomly assigned to the scan chains or determined by conventional scan insertion tools. At line 2, a variable count jail is set to 0, which is used to indicate when to break from the loop (lines 3-15) of the algorithm. In each iteration (lines 4-6), two scan cells $C_T$ and $C_f$ are chosen. $C_f$ is in the fan-in logic cone of $C_T$, and they are on the same scan chain. While assigning $C_T$ and $C_f$ into different chains may lead to a potential sensitive cell $C_T$, the swap operation may cause some scan cells that were on different chains to become on the same chain. Hence, at lines 7-13, the swap effectiveness is evaluated by counting the total number of potential sensitive cells in each scan chain. If the number does not decrease, the swap is accepted. Otherwise, only the swap with the probability $e^{\Delta N^*t/\tau}$ ($\tau$ is a user-defined variable) is accepted. The variable count jail counts the times of continuous rejections. If it achieves the value of a user-defined variable $N_{break}$, the loop stops.

Figure 8:
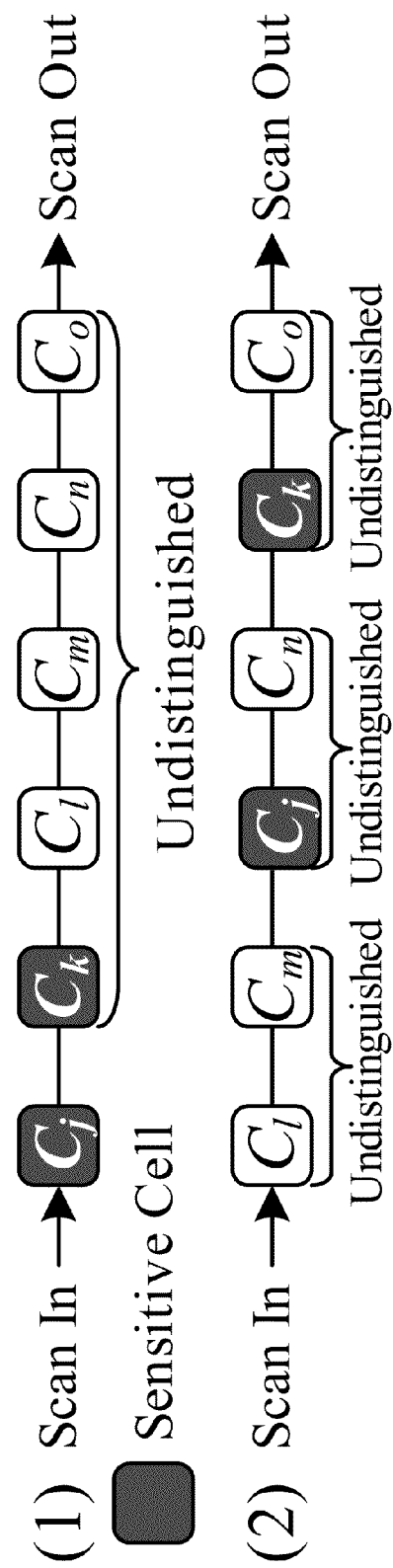
FIG. 8 illustrates an example of reordering scan cells on a scan chain for achieving a better diagnostic resolution according to various embodiments of the invention.

In addition to the number of sensitive scan cells, the distribution of the sensitive scan cells on a scan chain may also have an impact on the diagnostic resolution. FIG. 8 illustrates an example of reordering scan cells on a scan chain for achieving a better diagnostic resolution. In the figure, only $C_j$ and $C_k$ are sensitive cells. The faults at $C_k$, $C_l$, $C_m$, $C_n$, and $C_o$ cannot be distinguished if $C_j$ and $C_k$ are arranged next to each other (810). If the distribution of the sensitive cells is adjusted as shown (820), no matter where the actual fault is, the diagnostic resolution would be 2.

Figures 9A, 9B, 9C:
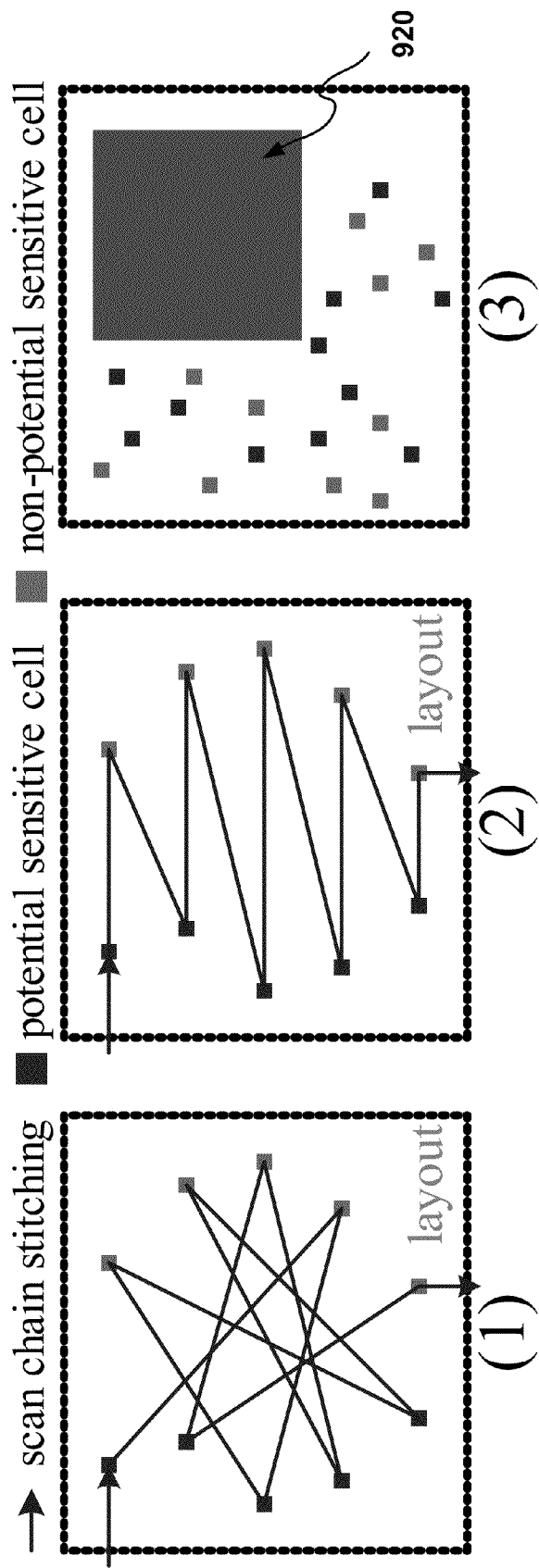
FIG. 9a illustrates an example of stitching scan cell in which layout wire lengths are not considered.
FIG. 9b illustrates an example of stitching scan cell in which layout wire lengths are considered.
FIG. 9c illustrates an example of stitching scan cell in which layout wire lengths are considered.

With some implementations of the invention, the formation of scan chains is based further on layout information of the circuit design. To use the layout information, the diagnosis-aware scan chain stitching methods according to various embodiments of the invention may be performed between the placement and the routing of system logic. FIGS. 9a and 9b illustrate two examples of stitching scan cells: one that does not consider wire lengths (9a) and the other that considers wire lengths (9b). It should be noted that in both of the examples, potential sensitive cells are evenly distributed along the scan chain so that the diagnostic resolutions are similar. However, the total wire length is shorter and the wire routing is more straightforward for the example in FIG. 9b than for the one in FIG. 9a. This may help lower the negative impact of scan chain insertion on the functionality of the original circuit design. The optimization of wire length may be achieved based on the well-known traveling salesman problem (TSP).

In the example in FIG. 9b, both the chain diagnostic resolution and the scan chain wire length are taken into account. Every wire for connecting two scan cells is still long in this example, however, because all of the potential sensitive cells are on the left side while all of the non-potential sensitive cells are on the right side. This shows that the distribution of potential sensitive cells and non-potential sensitive cells on the layout should also be considered while reducing the scan chain wire lengths.

In order to reduce the scan chain wire lengths, line 4 of the algorithm shown in FIG. 7 may be revised as follows: if many non-potential sensitive cells cluster without potential sensitive cells around them, the scan cell $C_T$ will be chosen from these non-potential sensitive cells with higher priority. For example, FIG. 9c shows the distribution of potential sensitive cells and non-potential sensitive cells during an iteration. Except in a circle region 920 where non-potential sensitive cells are clustered, potential sensitive cells and non-potential sensitive cells are roughly evenly distributed. Using the revised algorithm, $C_T$ may be chosen with a higher possibility from the non-potential sensitive cells in the cycle region 920.

Figure 10:
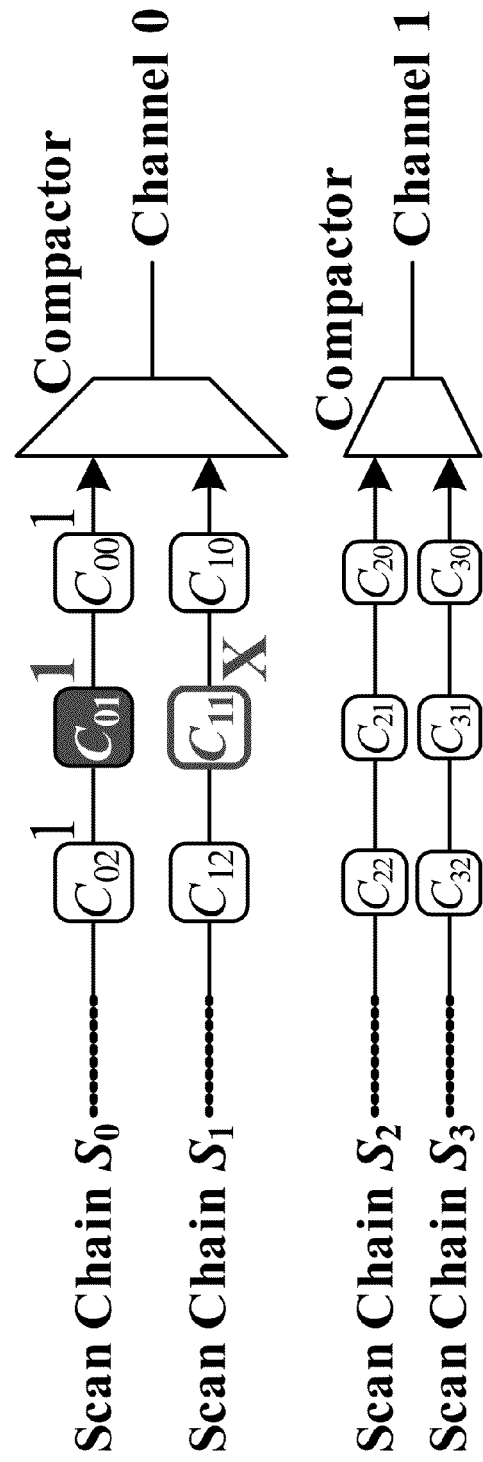
FIG. 10 illustrates an example of scan chains with compactors.

The disclosed scan cell stitching methods can be applied when compactors are used to compact test responses shifted out from scan chains. FIG. 10 illustrates an example of scan chains with compactors. In FIG. 10, scan chains $S_0$ and $S_1$ are compacted into the channel 0, and scan chains $S_2$ and $S_3$ are compacted into the channel 1. By shifting chain patterns, assume a SAO fault is identified to occur in $S_0$. When shifting chain patterns, compactors are usually bypassed and thus which scan chain is faulty may be determined. But when using scan patterns, compactors are normally enabled. With scan compaction, a shift-out cycle can affect the diagnostic resolution as shown in FIG. 10. Assuming $C_{01}$ is a potential sensitive cell as all the scan cells in its fanin logic cone are in $S_1$, $S_2$, or $S_3$. However, due to the compactor, even if $C_{01}$ does capture the sensitive bit 1, but if $C_{11}$ captures X, $C_{01}$ still cannot contribute to improving the chain diagnostic resolution. That is because, when shifting out the captured bits, the bits 1 and X will be compacted to X. This problem may be solved however, by moving the scan cells in the fan-in cones for $C_0$ and $C_{11}$ onto $S_2$ or $S_3$ (channel 1). As such, both $C_{01}$ and $C_{11}$ will be useful for diagnosis, because neither $C_{01}$ nor $C_{11}$ captures X when faults occur in $S_0$ or $S_1$.

Lastly, in operation 540, the scan chain stitching tool 400 outputs information of the scan chains. For example, the information of the scan chains may be stored in one or more computer-readable storage media (e.g., volatile or nonvolatile memory or storage), as shown with the output database 485 in FIG. 4

Conclusion

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. One or more non-transitory computer-readable media storing computer-executable instructions for causing one or more processors to perform a method, the method comprising:
   receiving information of scan cells for a circuit design;
   analyzing the circuit design and the information of scan cells to determine information of potential logic relationship between the scan cells;
   forming scan chains based at least in part on the information of potential logic relationship between the scan cells; and
   outputting information of the scan chains.

2. The one or more non-transitory computer-readable media recited in claim 1, wherein the forming is based further on layout information of the circuit design.

3. The one or more non-transitory computer-readable media recited in claim 2, wherein the layout information comprises information of wire lengths between scan cells.

4. The one or more non-transitory computer-readable media recited in claim 1, wherein the forming comprises:
   determining information potential sensitive cells based on the information of potential logic relationship between the scan cells, a potential sensitive cell of a scan chain being a scan cell of which fan-in cone contains no scan cells from the scan chain; and
   employing the information of potential sensitive cells to determine scan chains.

5. The one or more non-transitory computer-readable media recited in claim 4, wherein the employing comprises:
   optimizing number and distribution of potential sensitive cells for the scan chains.

6. The one or more non-transitory computer-readable media recited in claim 1, wherein the forming is further based on compactor information.

7. The one or more non-transitory computer-readable media recited in claim 1, wherein the information of scan cells comprises information of preformed scan chains, and the forming comprises modifying the preformed scan chains by swapping one or more pairs of scan cells between the preformed scan chains based at least in part on the information of potential logic relationship between the scan cells.

8. The one or more non-transitory computer-readable media recited in claim 1, wherein the information of potential logic relationship between the scan cells comprises information of fan-in cones for the scan cells.

9. A method, comprising: with a computer,
   receiving information of scan cells for a circuit design;
   analyzing the circuit design and the information of scan cells to determine information of potential logic relationship between the scan cells;
   forming scan chains based at least in part on the information of potential logic relationship between the scan cells; and
   outputting information of the scan chains.

10. The method recited in claim 9, wherein the forming is based further on layout information of the circuit design.

11. The method recited in claim 10, wherein the layout information comprises information of wire lengths between scan cells.

12. The method recited in claim 9, wherein the forming comprises:
   determining information potential sensitive cells based on the information of potential logic relationship between the scan cells, a potential sensitive cell of a scan chain being a scan cell of which fan-in cone contains no scan cells from the scan chain; and
   employing the information of potential sensitive cells to determine scan chains.

13. The method recited in claim 12, wherein the employing comprises:
   optimizing number and distribution of potential sensitive cells for the scan chains.

14. The method recited in claim 9, wherein the forming is further based on compactor information.

15. The method recited in claim 9, wherein the information of scan cells comprises information of preformed scan chains, and the forming comprises modifying the preformed scan chains by swapping one or more pairs of scan cells between the preformed scan chains based at least in part on the information of potential logic relationship between the scan cells.

16. The method recited in claim 9, wherein the information of potential logic relationship between the scan cells comprises information of fan-in cones for the scan cells.

17. A system comprising:
   one or more processors, the one or more processors programmed to perform a method, the method comprising:
   receiving information of scan cells for a circuit design;
   analyzing the circuit design and the information of scan cells to determine information of potential logic relationship between the scan cells;
   forming scan chains based at least in part on the information of potential logic relationship between the scan cells; and
   outputting information of the scan chains.

18. The system recited in claim 17, wherein the forming is based further on layout information of the circuit design.

19. The system recited in claim 17, wherein the information of potential logic relationship between the scan cells comprises information of fan-in cones for the scan cells.

20. The system recited in claim 17, wherein the forming comprises:
   determining information potential sensitive cells based on the information of potential logic relationship between the scan cells, a potential sensitive cell of a scan chain being a scan cell of which fan-in cone contains no scan cells from the scan chain; and
   employing the information of potential sensitive cells to determine scan chains.

* * * * *